United States Patent
Brooks et al.

(10) Patent No.: US 10,637,238 B2
(45) Date of Patent: *Apr. 28, 2020

(54) SYSTEMS AND METHODS FOR COORDINATING SIGNAL INJECTIONS TO UNDERSTAND AND MAINTAIN ORTHOGONALITY AMONG SIGNAL INJECTIONS PATTERNS IN UTILITY GRIDS

(71) Applicant: 3M INNOVATIVE PROPERTIES COMPANY, St. Paul, MN (US)

(72) Inventors: Brian E. Brooks, St. Paul, MN (US); Yang Lu, Singapore (SG); Andrew T. Tio, Singapore (SG); Gilles J. Benoit, Minneapolis, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 9 days.

This patent is subject to a terminal disclaimer.

(21) Appl. No.: 16/057,958

(22) Filed: Aug. 8, 2018

(65) Prior Publication Data
US 2018/0351356 A1     Dec. 6, 2018

Related U.S. Application Data

(63) Continuation of application No. 15/324,911, filed as application No. PCT/US2015/040357 on Jul. 14, 2015, now Pat. No. 10,074,977.

(Continued)

(51) Int. Cl.
    *H02J 3/00*       (2006.01)
    *G01R 19/25*    (2006.01)
(Continued)

(52) U.S. Cl.
    CPC ............ *H02J 3/00* (2013.01); *G01R 19/2513* (2013.01); *G05B 13/0265* (2013.01);
(Continued)

(58) Field of Classification Search
None
See application file for complete search history.

(56) References Cited

U.S. PATENT DOCUMENTS 7,821,156 B2    10/2010    Katz et al.
7,945,524 B2     5/2011    Anderson et al.
(Continued)

FOREIGN PATENT DOCUMENTS

CN     103346572     10/2013
EP      2485358      8/2012
(Continued)

OTHER PUBLICATIONS

Pasdar, "Detecting and Locating Faulty Nodes in Smart Grids Based on High Frequency Signal Injection," IEEE Transactions on Smart Grid, Jun. 2013, vol. 4, No. 2, pp. 1067-1075.
(Continued)

*Primary Examiner* — Jason Lin (57) ABSTRACT

Methods and systems for implementing experimental trials on utility grids. The variation of grid parameters are coordinated to create periods of time and areas of space from within which the variations of grid parameters do not overlap, allowing sensor data within those periods of time and areas of space to be associated with particular variations in grid parameters. This associated data can in turn be used to improve models of sensor response and utility grid behavior.

18 Claims, 6 Drawing Sheets

Related U.S. Application Data (60) Provisional application No. 62/025,614, filed on Jul. 17, 2014.

(51) Int. Cl.
| | | |
|---|---|---|
| *H02J 13/00* | (2006.01) | |
| *G05B 13/02* | (2006.01) | |
| *G05B 15/02* | (2006.01) | |
| *G05B 23/02* | (2006.01) | |
| *G01R 31/40* | (2020.01) | |

(52) U.S. Cl.
CPC .......... *G05B 15/02* (2013.01); *H02J 13/0013* (2013.01); *G01R 31/40* (2013.01); *G05B 23/0256* (2013.01); *H02J 2203/20* (2020.01); *Y02E 60/76* (2013.01); *Y02E 60/7807* (2013.01); *Y04S 40/12* (2013.01); *Y04S 40/22* (2013.01)

(56) References Cited

U.S. PATENT DOCUMENTS

| | | | |
|---|---|---|---|
| 7,991,512 | B2 | 8/2011 | Chandra et al. |
| 8,103,388 | B2 | 1/2012 | Goodnow et al. |
| 8,121,741 | B2 | 2/2012 | Taft et al. |
| 8,234,016 | B2 | 7/2012 | Boss et al. |
| 8,289,006 | B2 | 10/2012 | Nam et al. |
| 8,494,826 | B2 | 7/2013 | Richards et al. |
| 8,504,214 | B2 | 8/2013 | Genc et al. |
| 8,509,953 | B2 | 8/2013 | Taft |
| 8,571,721 | B2 | 10/2013 | Boss et al. |
| 8,583,405 | B2 | 11/2013 | Chow et al. |
| 8,589,198 | B2 | 11/2013 | McMullian |
| 8,600,572 | B2 | 12/2013 | Sri-Jayantha |
| 8,639,392 | B2 | 1/2014 | Chassin |
| 9,597,587 | B2 | 3/2017 | Bathiche |
| 2006/0195229 | A1 | 8/2006 | Bell et al. |
| 2007/0241759 | A1 | 10/2007 | Williams |
| 2008/0059118 | A1* | 3/2008 | Spurgeon ............... G05B 13/04 702/183 |
| 2010/0177450 | A1 | 7/2010 | Holcomb et al. |
| 2010/0306014 | A1 | 12/2010 | Chow |
| 2011/0112987 | A1 | 5/2011 | Basak et al. |
| 2011/0125657 | A1 | 5/2011 | Boss et al. |
| 2012/0155557 | A1 | 6/2012 | Bush et al. |
| 2012/0271574 | A1 | 10/2012 | Williams |
| 2012/0310558 | A1 | 12/2012 | Taft |
| 2013/0077367 | A1 | 3/2013 | Zhu et al. |
| 2013/0138482 | A1 | 5/2013 | Anderson et al. |
| 2013/0191052 | A1 | 7/2013 | Fernandez et al. |
| 2013/0191320 | A1 | 7/2013 | Avritzer et al. |
| 2013/0204557 | A1 | 8/2013 | Trudnowski et al. |
| 2013/0232094 | A1 | 9/2013 | Anderson et al. |
| 2013/0253667 | A1 | 9/2013 | Yoshinaga et al. |
| 2013/0268131 | A1 | 10/2013 | Venayagamoorthy et al. |
| 2014/0032187 | A1 | 1/2014 | Legbedji et al. |
| 2014/0148962 | A1 | 5/2014 | Venayagamoorthy |
| 2014/0236365 | A1* | 8/2014 | Martin ............... H04B 3/54 700/286 |
| 2015/0334353 | A1 | 11/2015 | Estevez et al. |

FOREIGN PATENT DOCUMENTS

| | | |
|---|---|---|
| KR | 20110035732 | 4/2011 |
| WO | WO 01/082444 | 11/2001 |
| WO | WO 2011/061153 | 5/2011 |
| WO | WO 2011/116074 | 9/2011 |

OTHER PUBLICATIONS

Pierre, "Probing Signal Design for Power System Identification," IEEE Transactions on Power Systems, May 2010, vol. 25, No. 2, pp. 835-843.

N. Zhou, et al, "Initial Results in Power System Identification From Injected Probing Signals Using a Subspace Method" IEEE Transactions on Power Systems, vol. 21. No. 3, Aug. 1, 2006, pp. 1296-1302 XP055444806.

International Search Report for PCT International Application No. PCT/US2015/040357, dated Oct. 21, 2015, 3 pages.

\* cited by examiner

SYSTEMS AND METHODS FOR COORDINATING SIGNAL INJECTIONS TO UNDERSTAND AND MAINTAIN ORTHOGONALITY AMONG SIGNAL INJECTIONS PATTERNS IN UTILITY GRIDS

BACKGROUND

The performance of utilities grids—their reliability, safety, and efficiency—can be drastically improved through sensing key parameters and using those results to direct the operations and maintenance of the grid, by identifying faults, directing appropriate responses, and enabling active management such as incorporating renewable sources into electrical grids while maintaining power quality.

Sensor networks are often used to monitor utilities grids. These sensor networks may include smart meters located at the ends of the grid, sensors at grid nodes, and sensors on or around the utilities lines, these sensors measuring grid parameters such as flow rates in water grids, power quality in electrical grids, or pressures in utilities grids. These sensors are transducers, usually outputting analog signals representative of the measured properties. These outputs need to be characterized to map to specific values of those properties, and/or classified so that they may represent particular states of the world, such as a potential leak that requires investigation, or identification of increases in reactive power when incorporating a renewable resource into an electrical grid. Characterization of sensors is usually done through bench testing, while the sensors may have various interferences in the environment surrounding them; in-situ characterization of sensors on a utility grid monitoring network would be preferred, but is difficult for the large numbers of sensors used to monitor a utilities grid and the difficulty in accessing many of those sensors.

The trend in analyzing grid sensor data and directing responses is "big data," which uses large amounts of grid historical data to build models used for classification and direction of responses. These big data models, however, are limited to correlations, as they mine historical data to build the models, limiting their effectiveness for actively directing treatments or making fine adjustments. Further, these big data models typically require large volumes of data that prevent highly granular understandings of grid conditions at particular grid nodes or locations or that can only achieve such granularity after long operations; some have applied machine learning techniques and improved models to increase speed and granularity, but even these approaches continue to rely on correlations from passively collected historical data.

Signal injections have been used to highlight grid faults, such as discovering nodes where power is being illegally drawn from an AC power grid; these techniques rely on already-characterized high-quality sensors such as "smart meters" and are occasional, grid-wide individual actions, not coordinated to be conducted concurrently or sequentially and thus not suitable for in-situ calibration of a large number of diverse sensors. Signal injections have also been used to test grid-wide response to large changes in high levels of the grid, such as at the HVDC distribution level. Those signal injections have been large, individual, and human mediated, not susceptible to automation, smaller-scale local testing or concurrent or sequential implementation of tests, again inappropriate for calibrating and characterizing the responses of individual local sensors in-situ. To adopt signal injection for regular in-situ characterization of sensors on a highly sensorized grid, there is a need to be able to inject signals concurrently and sequentially to increase sample sizes and enable automation without confounding sensor responses with other signal injections.

Utilities grid management would benefit greatly from real-time cause-and-effect understanding of sensor responses to overcome the issues with big data smart grid approaches and allow for real-time, granular, and fine-tuned grid monitoring and management to more fully capitalize on the potential of smart grid to optimize grid parameters and respond to potential grid pathologies, by enabling such optimization to be done at more local levels across these highly variant systems.

SUMMARY

The present invention is directed towards the automated coordination of signal injections into a utilities grid to enable multiple concurrent and sequential tests of sensor response to grid events, by receiving a set of potential signal injections, computing spatial and temporal reaches for the signal injections, generating a set of signal injections having non-overlapping reaches, and implementing the generated set of signal injections into the utility grid at the given times and locations.

DETAILED DESCRIPTION

Signal injections provide a means of characterizing sensor responses or improving sensor output classifications to improve understanding of current grid events on a utility grid monitored through a sensor network, such as "smart grid" efforts. This understanding may be improved and refined most efficiently when tests of sensor response to signal injections may be run concurrently and successively to maximize the sample size and produce spatial and temporal granularity in the understanding of sensor outputs, but without these various tests confounding one another's results. As a result, it is advantageous to automatically coordinate multiple signal injections into a utility grid in time and space ensuring a larger sample size than would be otherwise possible, while also ensuring that the samples themselves are not confounded by overlapping signal injections. The resulting large number of unconfounded experimental samples allows the generation of actionable, cause-and-effect knowledge that has sufficient temporal and spatial granularity to drive localized optimization, realizing the potential of "smart grid" optimization techniques for managing grid maintenance, fault response, improvements of efficiency and providing richer intelligence to grid operators.

Figure 1:
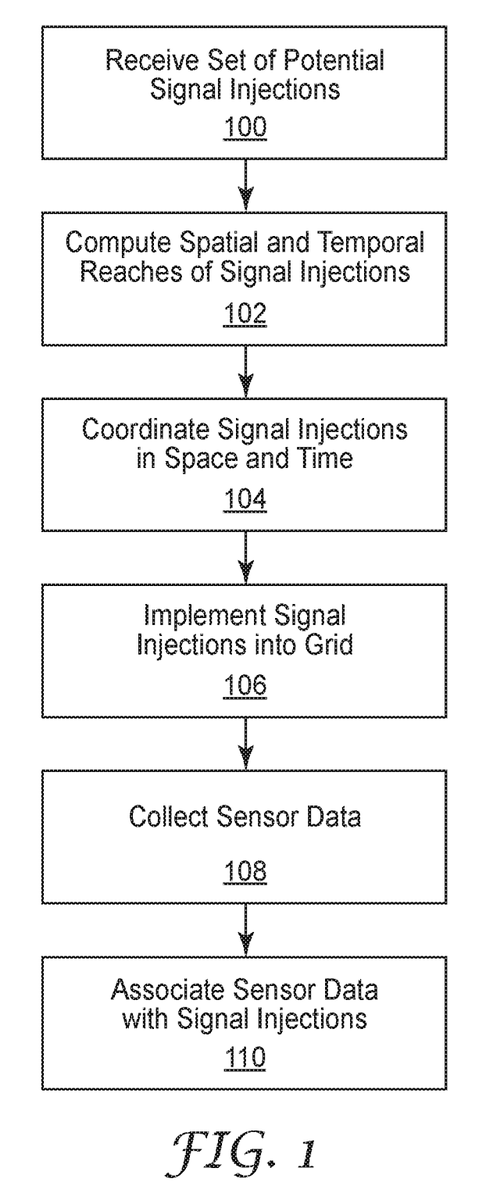
FIG. 1 is a flow diagram of the steps of a method of the invention.

FIG. 1 is a flowchart of a method of the invention. A set of potential signal injections are received in step 100, spatial and temporal reaches are computed for the potential signal injections in step 102, a plurality of the potential signal injections are selected and coordinated such that their spatial and temporal reaches do not overlap in step 104, and the signal injections are implemented into the utility grid in step 106. Optionally, sensor data may be collected within at least the spatial and temporal reaches of the signal injections in step 108. The sensor data is the output of sensors along the utility grid, such as the electrical waveforms output by transducers measuring grid parameters, or processed outputs from those sensors along the utility grid. Data collection may also be conducted continuously or over periods or areas beyond the spatial and temporal reaches. Optionally, the sensor data may be associated with particular signal injections in step 110.

A set of potential signal injections received in step 100. The potential signal injections are data representative of the time, location and nature of signal injections that may be implemented across the network to test models of sensor response. The nature of a signal injection is particular to the type of utility grid the signal injection is made into, along with particular characteristics of the signal injection, such as its magnitude, or the utility grid variables changed by the injection. The signal injections are controlled changes in grid parameters, for example, electrical signal injections in electrical grids such as increases or decreases in current, voltage, or power factor caused by actuating grid controls.

Signal injections to be made into utility grids may be implemented automatically through machine to machine controls (M2M), or may be human-mediated in their implementation, occurring though automated instruction of grid personnel to carry out particular activities such as deactivating a particular industrial load on an electrical grid. These signal injections are controlled variations in grid conditions based on changing aspects of grid operations, such as adjusting valves, activating power sources, or other such changes. These signal injections may be performed on utility grids including gas grids, water grids, and electrical grids. In gas grids, the signals may be injected through, for example, changing the routing of gas through pipes to increase or decrease the pressure at certain points. The responses to these signals may be the increase or decrease in the number and/or severity of leaks detected by a sensor network surrounding the grid pipes, or changes in downstream pressures connected to the areas being driven to high or low pressure. These signal injections may be accomplished in human-mediated cases through the manual adjustment of various valves and switches at the direction of a schedule distributed to maintenance personnel who perform these adjustment; these schedules may take various forms, such as maintenance queues, additional tasks, and may be distributed through a variety of electronic means such as email, text message, calendar reminders on a computer, tablet, smart phone or other portable computing device. In these human-mediated cases, the times of these adjustments may be audited by having the maintenance personnel check in using a networked device to record the time the changes are actually implemented, for use in the processing of subsequent data generated as a result of the grid response to these signal injections. In fully machine-to-machine implemented embodiments of signal injection on gas grids, the switches and valves are operated by actuators coupled to the system through a wired or wireless communications network, and responding to signals sent by the system or acting in accordance with instructions or schedules distributed to the controllers for those actuators by the system. Machine-to-machine implementations allow for more closely coordinated tests as there will be less variance in the time of implementation, and the improved timing allows more sophisticated trials to be conducted. In these implementations, monitoring of the sensor conditions and actuator states may be constant, to create a real-time understanding of relationships among spatially and temporally distributed influences, enabling changes in relationships as well as local sensor states to be detected and characterized, for example through factorial isolation of detected changes.

In electrical grids, human-mediated methods may include manual switching of power flow, switching of capacitor banks or load tap changers, activating or deactivating power sources connected to the grid, activating or deactivating heavy industrial equipment having significant effects on power draw (such as arc furnaces) or other major manually-controlled power loads on the grid. In these examples, the changes are made by the maintenance personnel at the direction of a schedule that is automatically generated and distributed to the appropriate maintenance personnel (e.g. those with access to and responsibility for particular controls); these schedules may take various forms, such as maintenance queues, additional tasks, and may be distributed through a variety of electronic means such as email, text message, calendar reminders on a computer, tablet, smart phone or other portable computing device. In these human-mediated cases, the times of these adjustments may be audited by having the maintenance personnel check in using a networked device to record the time the changes are actually implemented, for use in the processing of subsequent data generated as a result of these signal injections. These human-mediated methods may alter measurable factors such as power quality, line temperature, line sag, reactive power levels, and other factors, which may be captured by sensor networks observing those measurable grid factors.

In electrical grids, machine-to-machine (M2M) methods offer a greater measure of control, and can automatically inject selected and coordinated signals through a variety of means. This includes automation of the types of switching and maintenance behaviors that may be used in human-mediated examples such as automated switching of capacitor banks or selecting positions for load tap changers, and additionally M2M methods of signal injection may capitalize on greater precision and breadth of control to include actions such as coordinating use of devices such as appliances at end locations to create coordinated demand and loading at consumer locations, or to implement complex coordination of combinations of multiple types of grid-influencing actions to generate more complex conditions, or introducing changes into the automatic power factor correction units. These combinatoric possibilities are very difficult to address through big-data approaches, since even large volumes of data may only have limited sample sizes reflecting particular combinations, and the sheer number of combinatoric possibilities makes big data solutions to these problems nearly intractable. These signal injections may be initiated through automatic control of the associated grid components and networked devices, including power generation, switches, voltage regulation equipment such as load tap changers and capacitor banks used for reactive power management, smart meters and smart appliances receiving power from the grid, and other grid components susceptible to remote control by the system. These may take advantage of millisecond-level control capabilities to manipulate power quality variables such as waveform shape, reactive power levels, RMS voltage and current levels, through the effects of changing positions on load tap changers, opening or closing switches for particular capacitor banks, or the integration of distributed generation sources, addition or removal of new loads or the specific operation of automatic power factor correction units The injected signals may be simple, directing one individual grid action such as opening a valve in a water or gas grid, or bringing one particular renewable source online by connecting it to the grid through an actuated switch, or altering the output voltage from one substation in electrical grid examples to change the grid conditions, or they may be complex, composed of multiple grid actions coordinated such that their individual spatial and temporal reaches overlap to produce a multi-factor treatment at areas within those overlapping reaches. This multi-factor treatment may include variances of multiple different grid parameters, for example adjusting the output from a substation while connecting a photovoltaic inverter to the grid just downstream, to explore combinatoric effects of those parameters such as the effects of those example actions on the voltage waveform and level of reactive power in that branch of the grid. Another example of a complex grid action may be to vary both load tap changer positions and capacitor bank switching simultaneously to provide more fine-grained control over reactive power in an electrical grid. Multi-factor treatments may be used to produce multiple instances of similar variations of a particular grid parameter, for example to use additive effects to increase the magnitude of a particular variance of a grid parameter at one or more specific locations on the grid while protecting more sensitive neighboring parts of the grid by keeping them within narrower or different operational ranges by exposing those parts to only a component of the overall signal injection that is being made into the grid; for example, the power levels at sensitive nodes around a more robust node may each be given an increase that has a predicted spatial reach that includes the more robust node, but not other sensitive nodes, and these multiple sensitive nodes may each provide a power increase within their narrower operational ranges to produce a combined increase in power at the robust node that exceeds the individual increases at each sensitive node.

For complex signals, the temporal and spatial reaches are predicted based on treating the complex signal's effects on the system as a whole, composed set. For those complex signals, while individual grid actions will have overlapping spatial and temporal reaches, the defined set of grid actions that make up the complex signal is instead treated as one signal injection, with the overall spatial and temporal reach of the combination of the defined set of grid actions used to determine the areas of space and periods of time where no other signals may be injected into the grid, to maintain the orthogonality of the complex signal injection from other grid signal injections.

Complex signals may be input into the system having already been defined as the set of grid actions to be done together and the times and locations of those grid actions, after being derived by other systems or selected by grid personnel, or may be derived by systems selecting multiple grid actions from the set of grid actions as directed by, for example, a Partially Observable Markov Decision Process (POMDP) model exploring combinatorics or operating within constraints on operational conditions that vary from location to location across the grid.

Signal injections exploring grid responses may be composed by searching for waveforms that have a spatial-temporal regularity with any controlled grid activity, which are co-occurring in immediate or regular delayed fashion, through for example, Principal Component or Fourier analysis. These statistical regularities in waveforms or component waveforms (for example, the frequency, voltage, and/or current) link grid actions with changes in grid conditions to provide the set of available options for manipulating grid conditions based on active control of grid actions. Data on the observed times and locations of these waveform components relative to the grid actions may be used to determine spatial and temporal reaches for particular signal injections.

For the signal injections, temporal and spatial reaches are computed in step 102, based on the nature of the signal injections and the grid. The temporal reach is the period over which the sensor network will be observing events related to the injected signal. The temporal reach includes the duration of the signal itself, and the duration of the expected sensor response to the signal, including ongoing propagation of the signal, echoes, or other sensor responses associated with the signal. This temporal reach may be computed by using the expected time, at a high confidence interval, of the duration over which the sensor will be responding to the signal injection, in one example using a model of grid components and inputting the signal injection into the model, or using a historical model of the durations over which prior signal injections were detected along the grid, and using that as the duration for relevant data and a period from which to exclude other trials having a common spatial reach. The spatial reach is the reach over which grid sensors are likely to show response to that signal; this may be predicted through models that predict grid response to the signal injection, such as a grid component model that then uses the characteristics of the grid elements and the nature of the signal injection to calculate the area over which the signal injection will manifest, or a historical data model based on observed spatial reaches in prior signal injections similar to the one having its reach computed. The spatial reach can then be controlled by predicting, to a high confidence interval (for example, the 95% confidence interval), the furthest sensor that would show a response to the injected signal and preventing any other trial from being conducted if it is likely to produce a response in the region of spatial reach during the period of spatial uncertainty for the current trial. For example, for a signal injection made by switching a capacitor bank on a distribution network, the spatial reach may be the downstream portion of the distribution network, and an example of the temporal reach may be the time it takes for transients introduced by the switching of the capacitor bank to settle. These reaches are specific to the signal being injected, and the signal may be complex, having multiple types and locations of input that are all accounted for in setting the temporal and spatial scope, for example altering the responses of power quality management units at substations in different manners when bringing renewable energy sources on-line at a particular time; in this example, the spatial reach may be based on the extent of the grid served by those substations even beyond the reach of the power contribution from the renewable energy source, and the temporal uncertainty may include periods after the termination of that renewable source's use, due to the effects of the power quality management units on the power wave form even after removal of the renewable source. Reaches may also be computed using historical data on observed responses to specific grid actions, such as waveform components discovered through Fourier or Principal component analysis that are spatially and temporally proximate to previous instances of particular grid actions.

A processor is used to coordinate a plurality of signal injections on the grid, using the reach information as a constraint on assigning signal injections to particular times and locations in step 104; the areas and periods of the spatial and temporal reaches of signal injections are not allowed to overlap together, as such overlap could introduce confounds into the trials measuring sensor response to the injected signals, since there would be multiple signals that could potentially be detected in those overlapping places and times, interfering with one another or creating uncertainty about what signal was being detected. Note that both the temporal and spatial reaches must overlap for signals to confound one another; signals may overlap in time if they do not overlap in space, and my overlap in space if there is no overlap in time. The coordination of the signal injections is preferably done through graphical modeling techniques, such as Principal Components Analysis, Bayesian networks or Markov random fields or subspecies thereof, configured to maximize the parsimony and completeness of the set of selected non-interfering signal injections to be implemented across the grid over a period of time. Other grid control activities or natural variances in grid parameters which occur randomly with respect to the selected signal injections may continue to occur on the grid within the reaches of the coordinated signal injections.

Coordination of the signal injections may be done to implement particular experimental trials in these non-confounding periods of space and time, to improve the understanding of grid conditions and sensor response. A Bayesian Causal Network may be used to look for dependencies in the data to identify potentially valuable trials that may discover grid control and sensor response knowledge. Systematic multivariate experimentation is done to analyze the directionality and variables involved in the underlying causal paths for those waveform components, by going back to the normative operational constraints and using constrained randomization, and experimental designs (such as Latin Square) to systematically explore which grid control elements and combinations thereof are the underlying cause of the waveforms. These experimental designs may be iterated to refine the analysis, for example eliminating ¾ of the controls on a basic first pass, through elimination of those controls that are random with respect to the waveform components of interest, and then using factorial combinations of the remaining controls in a second trial to properly identify the control or combination of controls causally linked to those waveform components of interest.

In another example, a Partially Observable Markov Decision Process (POMDP) could be used to sequentially make signal insertion decisions to continuously reduce uncertainty about the conditional dependence structure among grid components. The POMDP may further be structured to maximize the expected reward whereby the reward function is a combination of uncertainty reduction and other operational objectives. Other operational objectives include, for example, on electrical grids, load balancing, power quality optimization, renewable integration, and fault prediction indices; on water grids, flow optimization, loss prevention, management of infrastructure robustness; on gas grids, reserve management, leak prevention and minimization, and/or management of infrastructure robustness. This management of signal insertion ensures that signal injections will be coordinated such that they do not overlap in their temporal and spatial uncertainties. Overlapping on one of the dimensions, space or time, is an acceptable part of the coordination of the network to maximize learning per time period by conducting multiple trials simultaneously, and conducting trials back-to-back, but the signal injections must be separated on at least one of either the temporal or spatial level to ensure that data can be properly associated with a given signal injection and provide clean data regarding the grid response to that signal injection, unconfounded by other signal injections. In some embodiments, the coordination of the signals may allow overlap of the spatial and temporal reaches if the signal injections that overlap in both dimensions affect different grid parameters that do not interact with one another, which may be determined from, for example, metadata for each signal injection identifying the affected grid parameters for that signal injection and a table of interacting grid parameters which may be based on theoretical or observational data on the behavior of the grid parameters.

In some embodiments, the signal injections may also be constrained by the operational ranges of the grid, in addition to the spatial and temporal reaches of other signal injections. In these embodiments, normative operational constraint data is received and the predicted or actual grid conditions at the time of the signal injection are combined with the predicted effects of the signal injection, and the results of that combination may be compared to the permissible states of the grid to determine whether or not a signal injection can be assigned to a particular time and location. Alternatively, the signal injections available for input may be restricted to include only control states or combinations of control states that are used within the grid's normal operational envelope, excluding the possibility to select signal injections that would place controls into states outside of their normal ranges.

Figure 5:
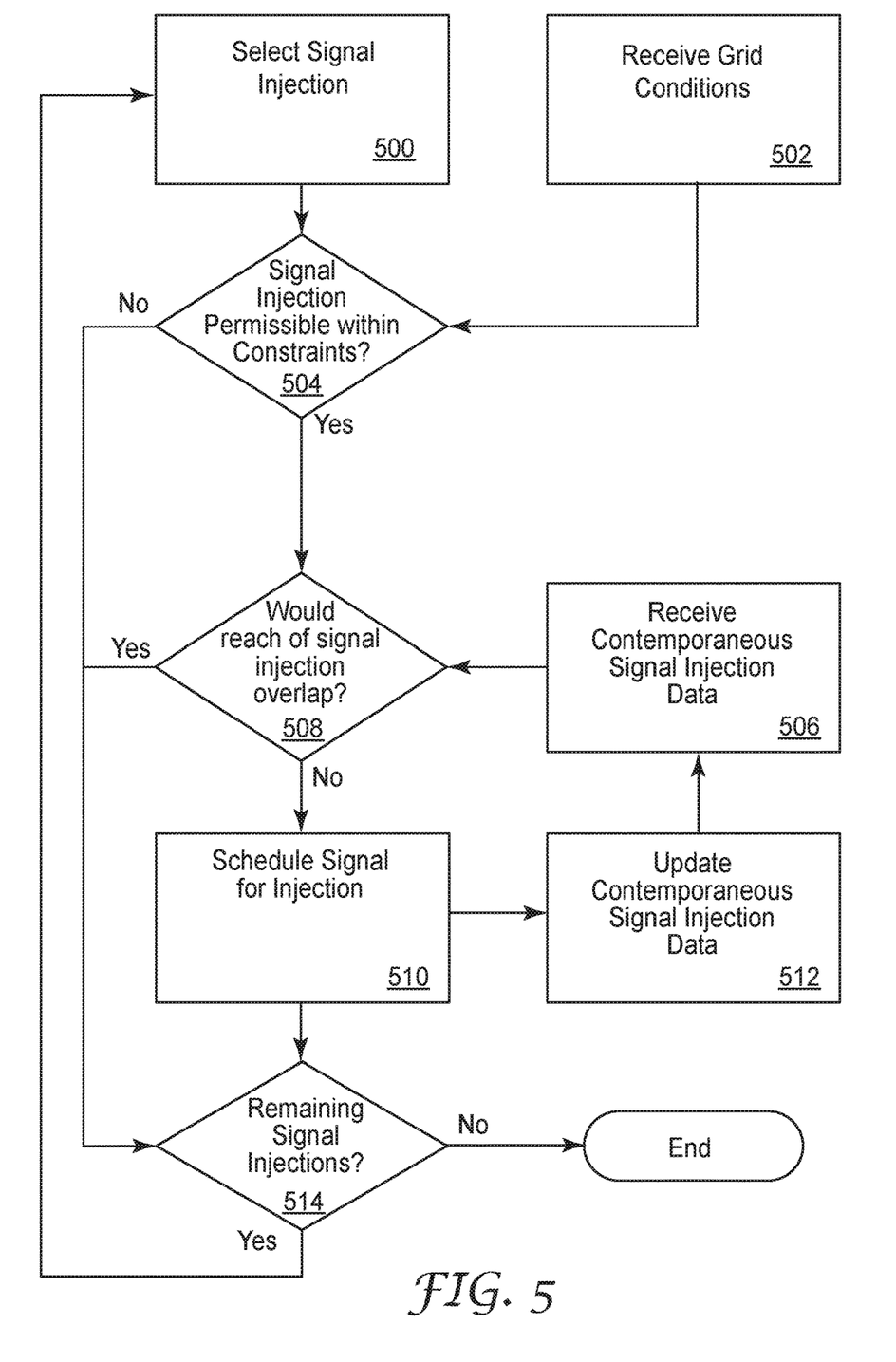
FIG. 5 is a flowchart for an iterative process for assigning signal injections to particular times and locations.

FIG. 5 details one non-limiting example embodiment of a method for coordinating the signal injections. In this example of an iterative approach to coordinating signals, a signal injection is selected 500, current grid conditions are received 502, and it is determined whether or not the selected signal injection will be within grid constraints based on the grid conditions 504. If the selected signal injection is within grid constraints for the grid conditions, contemporaneous signal injection data is received 506 and used to determine whether the selected signal injection overlaps with any current signals 508, and if it does not overlap, the signal scheduled for insertion 510 and contemporaneous signal injection data is updated 512. The process continues to iterate as long as there remain signal injections that may be placed 514. If the signal injection is determined inconsistent with grid constraints in step 504 or is determined to overlap with existing signal injections in spatial and temporal reach in step 508, the signal injection is rejected as a possibility and a new signal injection is selected if one remains to be placed.

A signal injection is selected in step 500. The signal injection may be selected from a table of potential signal injections, ranking the signal injections by potential value or the required number of samples testing that signal injection for a particular experimental design. The selection may be made by proceeding through these ranked injections in order, starting with the highest-priority signal injection.

Grid conditions are received in step 502. Grid conditions are current measurements where signals are being selected for immediate injection, or predictions based on current models and/or historical data for the time the signal injections are being selected and coordinated for. Grid conditions include operational parameters that must be kept within certain ranges for normal operations, such as levels of reactive power in electrical grids, which are needed to be maintained above certain thresholds for distribution.

The compliance of the selected signal injection with grid constraints is determined in step 504, based on the grid conditions. Each signal injection has effects associated with it, for example a signal injection involving the switching of load tap changers at a substation will increase or decrease the available reactive power near that substation. These effects are added to the grid conditions received in step 502 and compared to operational constraints. The operational constraints define the permissible states of various grid parameters, for example the threshold level of reactive power required to avoid a crash in power transmission, or other aspects of normal operating conditions for a grid, such as pressures or flow rates at certain points on water or gas distribution networks. In this example, the sum of the selected signal injection effect and the grid conditions is compared to the constraints. If the sum is within the constraints, the signal injection is passed on to the next stage, and if not, the signal injection is rejected and the system moves on to the next possible signal injection, or if no signal injection possibilities remain to be placed, the process ends, in accordance with step 514. Contemporaneous signal injection data is received in step 506. The contemporaneous signal injection data is the ongoing and/or planned signal injections and their spatial and temporal reaches. The contemporaneous signal injection data may be limited to ongoing and/or planned signal injections which have a temporal reach including the time of the selected signal injection or which are scheduled to occur during the temporal reach of the selected signal injection.

The spatial and temporal reaches of the selected signal injection are compared with the contemporaneous signal injection data in step 508. If the selected signal injection does not overlap with the contemporaneous signal injection data in both spatial and temporal reach, then the signal is approved for insertion and moves on to step 510. If the selected signal injection would overlap in both space and time with an ongoing and/or planned signal injection, the selected signal injection is rejected, and a new signal injection is selected to restart the process or the process ends in accordance with step 514.

Signals approved for insertion are scheduled for insertion in step 510. In this step, signals for immediate insertion are implemented immediately, by either messaging human implementers or activating the appropriate actuators and other controls needed to effectuate the selected signal injection, for example activating the actuators on capacitor bank switches at a substation on an electrical grid. For examples where the signals are being scheduled ahead of time, step 510 involves scheduling the actions to take place at their designated time, either by adding the signal injection activities to the maintenance queues or other directions provided to human implementers, or scheduling the automated activities in M2M embodiments of this example.

The contemporaneous signal injection data is updated in step 512. This is done in this example by adding the signal scheduled for insertion in step 510 and its respective spatial and temporal reaches to the list of signal injections which are received in step 506 of subsequent iterations and against which the spatial and temporal reaches of selected signal injections are compared to in step 508.

The process continues to iterate as long as there remain signal injections that may be placed, which is determined in step 514. This is determined in this example by checking the table of potential signal injections for signal injections that have not yet been selected and tested. If such signal injections exist, the selection step 500 is returned to; once no more signal injections remain to attempt to be placed for a particular time, the process ends.

Returning to FIG. 1, the coordinated signal injections are then implemented in the utility grid in step 106. The signals are then injected into the sensor network according to the coordinated set of signal injections and upholding their temporal and spatial uncertainty constraints, by taking the directed grid actions at the proper times and locations. The signal injections may be implemented by human actors, such as grid maintenance personnel, by directing them to perform the grid actions such as hitting switches in electrical grids, or opening and closing valves on water and gas distribution grids, through distributing appropriate instructions to those grid personnel through means such as email systems, automated messaging, queuing systems, or other means of instructing the human actors on what actions to take to influence the grid and when and where to implement them. The signal injections may also be partially or wholly implemented through machine-to-machine actions, such as having processors direct the actions of actuators controlling switches and valves, or controllers automatically directing the activation of renewable sources or otherwise implementing the directed grid actions, based on signals and/or data distributed to those processors and actuators, switches, sources and other grid components detailing the grid actions to take and the time and location for those grid actions to be taken.

Sensor outputs are collected for at least the areas of the sensor network within the temporal and spatial uncertainty of the injected signals in step 108. Where data is collected continuously or for periods that include times and spaces outside the reaches of signal injections on the network, the data from those times and locations may be parsed out from the sensor network data being collected continuously. For signal injections that have been coordinated to prevent overlapping spatial and temporal reaches, the response and the injected signal may be associated based on the temporal and spatial reaches, as the reaches are used to prevent overlapping signal injections from confounding each other, by ensuring a definite time and location over which the effects of just one particular signal injection may be observed and allowing multiple signal injections to be made concurrently, and for signal injections to be made consecutively into the grid to increase sample sizes and knowledge without confounding the signal injections. This associated data may be used to refine models of sensor response used to characterize or classify sensor outputs based on the sensor outputs and the signal injections that influenced those sensor outputs. Alternate uses for the data include updating and refining models of grid response to particular grid actions, or improving active control protocols to maintain certain operational parameters or pursue operational goals using knowledge of the impact of the signal injection on grid conditions through machine learning.

Figure 2:
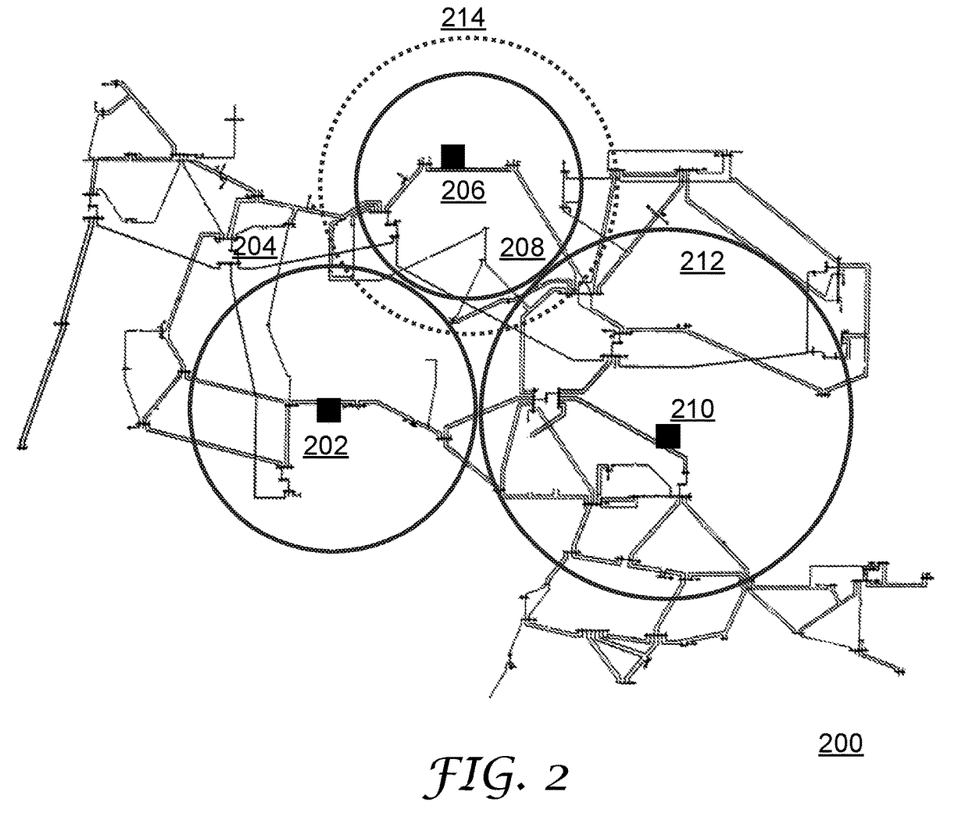
FIG. 2 is a map of a utility grid, its associated network of sensors, and the spatial reaches of signal injections selected for implementation by an example of the invention.

FIG. 2 is a diagram of a utility grid where multiple concurrent signal injections are coordinated according to their spatial and temporal reaches, depicting the locations and reaches of coordinated signal injections to be made concurrently into the grid at a point in time, to perturb the grid for observation and measurement without the signal injections confounding the measurements of one another's effects, in accordance with examples of the invention. The map 200 illustrates an area with many lines and other grid elements, and electrical substations where automated action can be taken, located at 202, 206, and 210, with an example of the automated actions at those substations being switching on or off particular capacitors and adjusting the position of load tap changers to alter the phase of current and voltage with respect to one another and control the level of reactive power at that substation. Spatial reach 204 is computed for the selected load tap changer and capacitor switch positions selected for a signal injection that is made at substation 202, determined by historical data and/or models of the effects of that selection and when and where its effects may be observed within a 95% confidence interval. Spatial reaches 208 and 212 are likewise computed for the selected actions at taken at substation 206 and substation 210 respectively. While the actions at all three substations are made concurrently and thus overlap temporally, the reaches do not overlap spatially, and thus grid responses to the signal injections within each of the spatial reaches 204, 208, and 212 may be associated with the signal injections and 202, 206, and 210 respectively to determine the response of sensors within the reach of each of those signal injection to those particular signal injections without the multiple concurrent signal injections confounding one another. If, for example, during the coordination stage, the signal injection at substation 202 with spatial reach 204 was already selected, and a potential signal injection at 206 had a larger, overlapping spatial reach 214, the signal injection having spatial reach 214 would be rejected in the coordination process and would not be able to be selected concurrently with the signal injection at 202 having spatial reach 206 because it would overlap, and thus that signal injection would be rejected and another selected that had a reach which did not overlap existing signal injection selections in space as well as time.

This coordination allows multiple signal injections to automatically be implemented on the grid without compromising the effectiveness of those signal injections in refining models of sensor understanding and grid response to the signal injections, enabling sensing and control systems to automatically produce multiple samples simultaneously and accelerating the process of developing sensor understanding and event classification criteria on utility grids.

Figure 3:
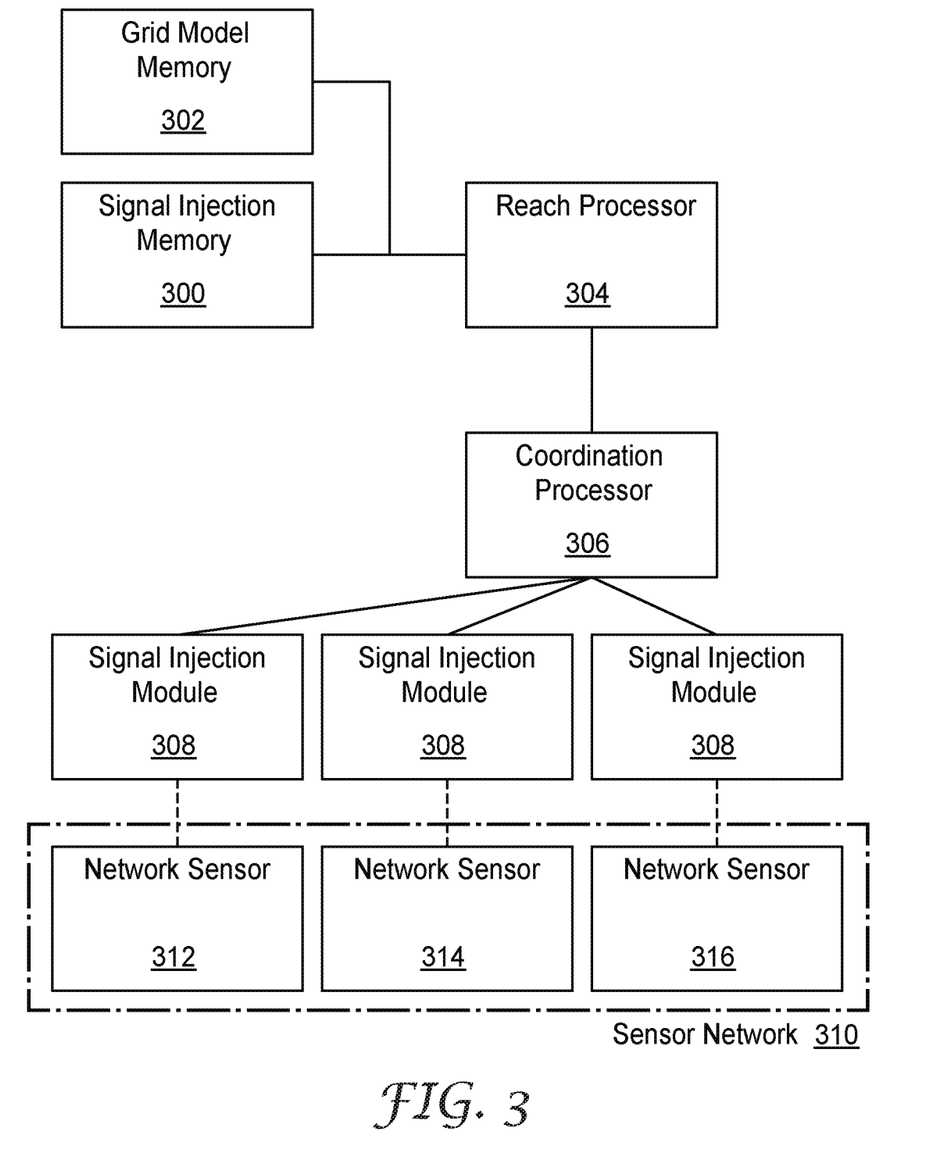
FIG. 3 is a system diagram of a system of the invention.

FIG. 3 is a diagram of an embodiment of the invention as a coordinated utility grid system. Memories may be known computer storage means such as flash memory, hard disk drives using magnetic media, or other methods for data storage that can store the data and be accessed frequently and regularly. Processors may be configured to make the calculations through software instructions. Connections among the components may be hard-wired, use of common processors for multiple steps, or networked through wired or wireless means such as the various 802.11 protocols, ZigBee or Bluetooth standards, Ethernet, or other known means for transmitting data among the separate sensors, processors, memories and modules. The sensors, memories, processors, and modules may be distributed across locations, including at the sensors themselves, or co-located in intermediate or central locations.

Signal injection memory 300 stores the characteristics of signal injections that may be made into the utility grid. This memory is configured to store the characteristics of potential signal injections, including the time, location, magnitude and parameters being affected by the signal injection. This memory may also store implementation data for the signal injection, such as the set of instructions to be presented to grid personnel for human-mediated embodiments, or the actuators and commands to be distributed to them in machine-to-machine embodiments of the invention.

Grid Model Memory 302 stores grid information used to compute the spatial and temporal reaches of signal injections. The grid information may, for example, be stored as databases of grid characteristics, models of grid response, models of components and their interconnections, or a set of controllable grid actions with associated observed changes in grid conditions such as components of overall power waveforms associated with grid actions in electrical grids, discovered through Fourier or Principal Component Analysis. Examples of the components and interconnections used to predict reach on utility grids include pipe lengths, pipe widths, and junction locations in water grids, pipe lengths, pipe widths, and junction locations in gas grids, or sources, substations, connecting lines, the sources and sinks of current, for electrical grids. Models of grid responses may be based on the physical properties of the utility and the grid components, and/or models based on the historical spatial and temporal response characteristics of the utility grid to past grid actions.

Reach processor 304 computes the spatial and temporal reaches for signal injections using grid properties or response models from the grid model memory 302 and signal injection characteristics by using those grid characteristics or models and the characteristics of the signal injection to predict the periods of time and regions of space where the grid response to the signal injection may be detected by sensors. For example, the reach processor may use the signal injection characteristics to identify the grid actions that will be used to implement the signal injection, and reference the historical data on those grid actions to determine the previous observations regarding the spatial and temporal reaches of those particular types grid actions, then use those previous observations to predict the spatial and temporal reach for the signal injection.

Coordination Processor 306 is a processor configured to apply graphical modeling techniques, such as Bayesian networks or Markov random fields or subspecies thereof, to the set of signal injections and their computed regions to determine a set of signal injections to implement while maintaining the orthogonality of those signal injections through placing them in space and time such that the spatial and temporal reaches of the signal injections do not overlap.

Signal implementation means 308 may be either tools for distributing and ensuring compliance with instructions governing the signal injections and their coordination across the utility grid in human mediated embodiments, or may be processors, controllers, and actuators used to automatically implement the signal injections in machine-to-machine embodiments of the invention. Examples include, for machine-to-machine examples, actuators controlling valves in water and gas grids or control circuits and actuators situated at electrical substations such as controls for the positioning of load tap changers or switches for capacitor banks used to manage reactive power, or switches controlling connections between distributed power sources such as solar or wind generators and the remainder of the grid. For human-mediated embodiments, examples include automatic generation and distribution of emails or text messages, computing devices carried by maintenance personnel and the servers they sync to for receiving queuing instructions and reporting completion of tasks and status of the grid and/or completion of assigned maintenance tasks.

Sensor network 310 may optionally be a part of systems embodying the invention. The sensor network may be a plurality of communicatively linked individual network sensors 312, 314 and 316 which are distributed across the utility grid to measure the grid parameters such as flow rates, current, voltage, line temperature, line sag, and whose output may reflect the changes in grid conditions resulting from signal injections. These network sensors may be, for example, methane detectors, sensored cable terminations, water flow meters, electrical "smart meters", or other such grid sensors. These sensors monitor changes in grid conditions stemming from the implemented signal injections, and that data may be parsed according to the spatial and temporal reaches of the signal injections based on the time and location at which the sensor captures the data.

Figure 4:
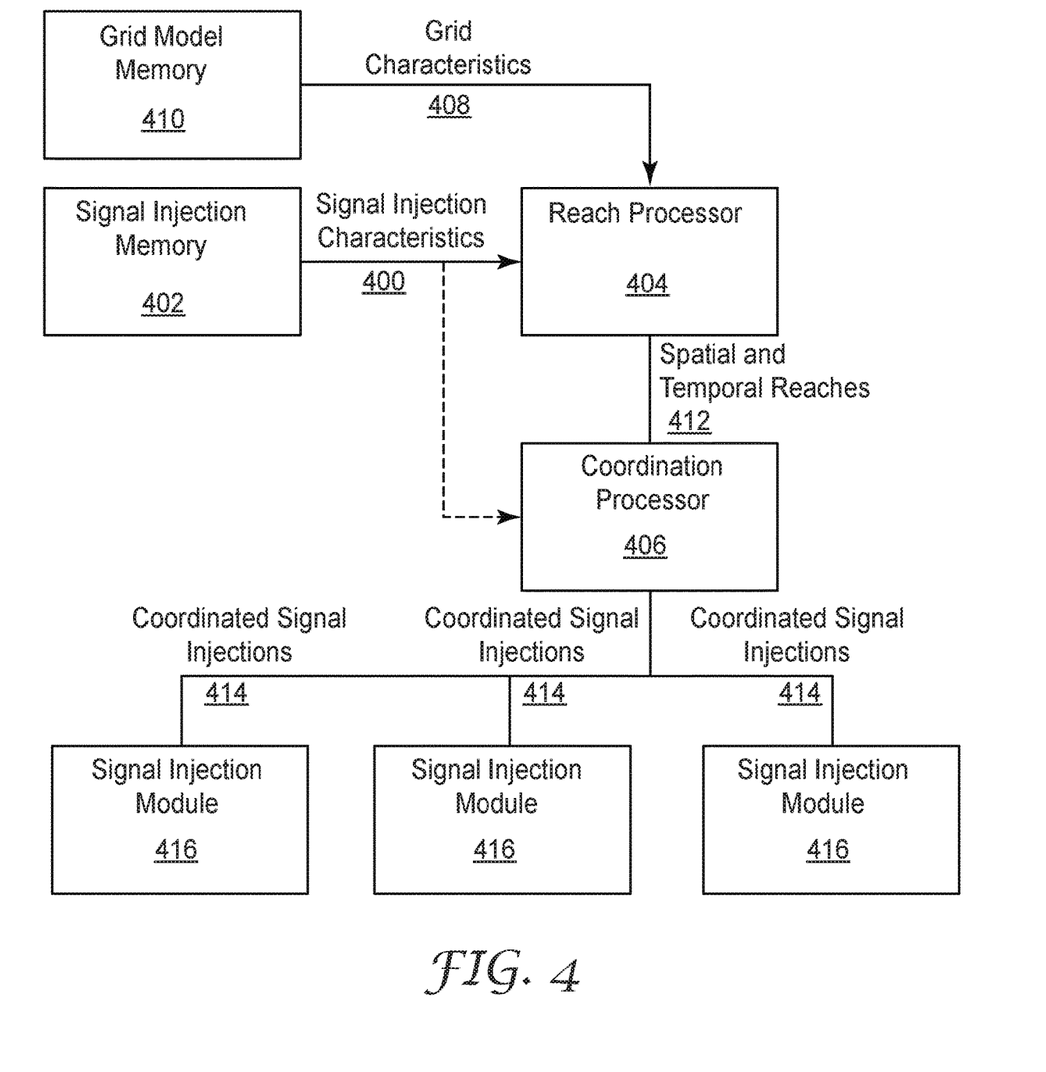
FIG. 4 is a data flow diagram of the flows of information among various components of a system of the invention.

FIG. 4 is a data flow diagram showing the transfer of information among elements of an example of the invention as a coordinated utility grid system, and the transformation of that information at each element to automatically coordinate and implement signal injections into a utility grid.

Signal injection characteristics 400 is data describing the signal injections that may be implemented on the grid, including information such as the location, including the magnitude, time, location, and nature of the signal injections. The nature of the signal injections may include the particular actions taken to manipulate the grid parameters or the particular grid parameters to be manipulated to implement the signal injection. The signal injection characteristics 400 are stored in signal injection memory 402, and are transferred to the reach processor 404 and optionally to the coordination processor 406. At the reach processor, the signal injection characteristics and the grid characteristics 408 from the grid model memory 410 are used to compute the spatial and temporal reaches 412 for a given signal injection in a particular location.

Spatial and Temporal Reaches 412 define the period of time and area of space that will be affected by a particular signal injection. These are initially defined at the reach processor 404 which predicts the period of time and area of space, and is then sent to the coordination processor 406, which arranges spatial and temporal reaches into non-overlapping coordinated sets of signal injections 414.

Coordinated Signal Injections 414 are definitions of the time and place at which to implement particular signal injections into the grid, and the details of implementing those signal injections. The details of implementing the signal injections may be instructions to be distributed to maintenance resources that will be taking the required actions for human implemented embodiments, or may be machine instructions for controlling the actuators and other elements that will be implementing the signal injections in machine-to-machine embodiments of the invention. The times and locations for the signal injections are determined by the coordination processor 406 while the instructions are based on the signal injection characteristics 400, and are sent to the signal implementation means 416, for either direct machine-to-machine implementation of the selected signal injections at the directed times and places, or for the scheduling or queuing of maintenance resources and distribution to those resources that will be implementing the signal injections in embodiments where the signals are injected by human actors.

Figure 6:
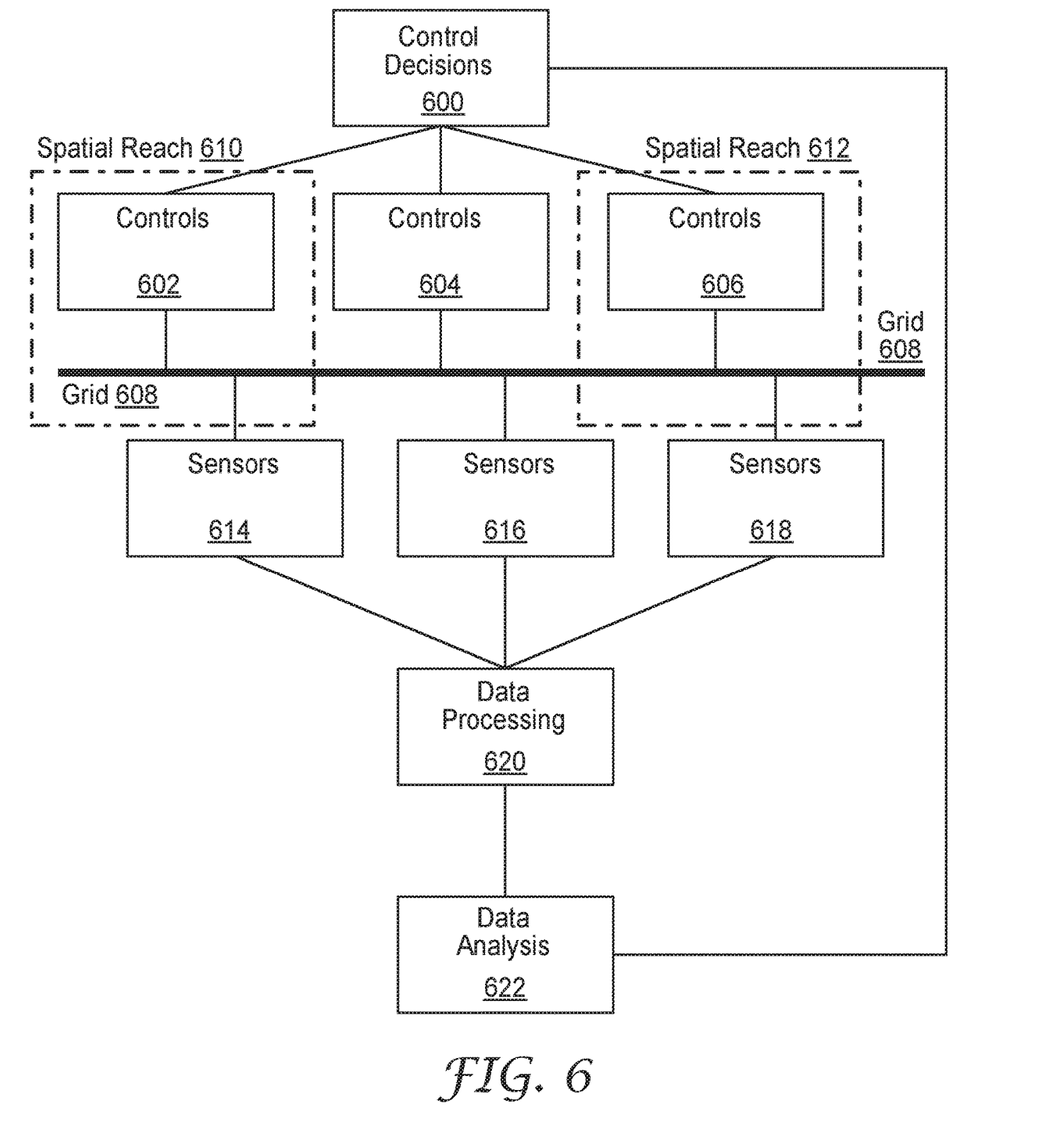
FIG. 6 is a diagram depicting the architecture of system embodiments and their interactions with a utility grid.

A simple example of an overall architecture involving an example embodiment of the invention is presented in FIG. 6. The control decision layer 600 makes decisions about the states for some or all gird controls. Grid control decisions are made according to methods ensuring that the manipulation of controls creates samples that do not influence one another, and optionally selecting the control decisions to provide high learning value or to improve particular grid parameters such as ensuring certain voltage levels in electrical grids, or flow rates in gas or water grids. The control decisions from the control decision layer 600 are carried out by the controls 602, 604, and 606. Examples of particular controls include capacitor bank switches, load tap changers, switches and storage devices on electrical grids, or valves and sources on water and gas grids. The controls may carry out the control decisions by, for example, actuating switches, moving load tap changer positions, and narrowing or widening valves. The actions of the controls change grid parameters, and those changes propagate through the grid 608. For example, opening a valve on a gas grid may cause pressures to increase downstream over time, within a certain distance from the valve, or in an electrical grid, power quality and reactive power levels may change based on the switching on or off of a capacitor bank. Sensors 614, 616, and 618 placed along the grid measure grid parameters, and detect the propagation of the signal injection through the grid 608. The signal injections are limited in the extent to which they propagate through the grid 608, defined as the spatial reach of that signal injection such as the spatial reach 610 outlining the region affected by the signal injected by control 602 and including the connection of sensor 614 to the grid 608, and spatial reach 612 outlining the region affected by the signal injected by control 606 and including the connection of sensor 618 to grid 608. Data processing layer 620 associates the data from sensors 614, 616, and 618 with signal injections whose spatial and temporal reaches include the sensor data, for example associating data from sensor 614 with data from a signal injection implemented by control 602 based on spatial reach 610, and associating data from sensor 618 with a signal injection implemented by control 606 based on spatial reach 612. The associated sensor data from the data processing layer 620 is then analyzed by the data analysis layer 622 to determine understandings about grid behavior and sensor response. This understanding of grid behavior generated by the data analysis layer 622 may, for example, take the form of sensor response models which are used to interpret the outputs from grid sensors 614, 616, and 618 during ordinary operations, for example to set thresholds or alerts for brownout conditions when voltage drops in an electrical line, or setting an alert for methane levels crossing normal operational thresholds. The data analysis layer 622 may interface with the control decision layer 600 to iteratively coordinate and implement signal injections into the grid and provide information that improves the selection of signal injections to implement, for example by predicting the effects of a signal injection on the grid or computing the extent to which learning may be refined by a particular signal injection.

The invention claimed is:

1. A method for delivering coordinated signal injections into a utility grid, comprising:
   receiving spatial and temporal reaches for a plurality of signal injections, wherein the temporal reach includes a duration of one of the signal injections and an expected duration of a response to the one signal injection;
   selecting times and locations for the plurality of signal injections to be implemented into a utility grid such that the spatial and temporal reaches of the signal injections do not overlap; and
   implementing the signal injections into the utility grid at the selected times and locations, wherein the signal injections are implemented by changing the state of grid controls,
   wherein the signal injections are at least one of changing valves, pressures, and flow rates in a gas grid.

2. The method of claim 1, further comprising collecting data from sensors along the utility grid.

3. The method of claim 2, further comprising associating the collected data from the sensors with the signal injections, based on the time and location of the sensor data and the spatial and temporal reaches of the signal injection.

4. The method of claim 1, wherein implementing the signal injections is dispatching grid personnel to perform a task.

5. The method of claim 1, wherein a graphical modeling technique is used for selecting the times and locations the plurality of signal injections are to be implemented.

6. The method of claim 5, wherein the graphical modeling technique is a Bayesian Causal Network.

7. The method of claim 1, wherein a Partially Observable Markov Decision Process is used for selecting the times and locations the plurality of signal injections are to be implemented.

8. The method of claim 1, wherein the spatial reach is computed based on a database of utility grid response to prior signal injections.

9. The method of claim 1, wherein the temporal reach is computed based on a database of utility grid response to prior signal injections.

10. The method of claim 1, wherein at least some of the plurality of the signal injections are made into the utility grid simultaneously.

11. A system for making coordinated signal injections into a utility grid, comprising:
   a memory configured to store spatial reaches for a plurality of signal injections;
   a memory configured to store temporal reaches for the plurality of signal injections, wherein each of the temporal reaches includes a duration of one of the signal injections and an expected duration of a response to the one signal injection;
   a processor configured to select a set of times and locations for signal injections within which the temporal reaches and spatial reaches are not both overlapping; and
   a plurality of controls on a utility grid which implement the signal injections at the selected times and locations,
   wherein the signal injections are implemented by changing the state of grid controls,
   wherein the signal injections are at least one of changing valves, pressures, and flow rates in a gas grid.

12. The system of claim 11, further comprising a plurality of sensors along the utility grid.

13. The system of claim 12, further comprising a processor configured to associate data from the plurality of sensors with the signal injections.

14. The system of claim 11, wherein the processor is configured to select the times and locations for signal injection using a graphical modeling technique.

15. The system of claim 11, further comprising a processor configured to compute a spatial reach for a signal injection based on a database of grid response to prior signal injections.

16. The system of claim 11, further comprising a processor configured to compute a temporal reach for a signal injection based on a database of grid response to prior signal injections.

17. A method for delivering coordinated signal injections into a utility grid, comprising:
   receiving spatial and temporal reaches for a plurality of signal injections, wherein the temporal reach includes a duration of one of the signal injections and an expected duration of a response to the one signal injection;
   selecting times and locations for the plurality of signal injections to be implemented into a utility grid such that the spatial and temporal reaches of the signal injections do not overlap; and
   implementing the signal injections into the utility grid at the selected times and locations, wherein the signal injections are implemented by changing the state of grid controls,
   wherein the grid controls are energy storage devices.

18. A method for delivering coordinated signal injections into an electrical grid, comprising:
   receiving spatial and temporal reaches for a plurality of signal injections, wherein the temporal reach includes a duration of one of the signal injections and an expected duration of a response to the one signal injection;
   selecting times and locations for the plurality of signal injections to be implemented into an electrical grid such that the spatial and temporal reaches of the signal injections do not overlap; and
   implementing the signal injections into the electrical grid at the selected times and locations, wherein the signal injections are implemented by changing the state of grid controls,
   wherein the grid controls are at least one of capacitor banks, load tap changers, and inverters.

* * * * *

UNITED STATES PATENT AND TRADEMARK OFFICE
CERTIFICATE OF CORRECTION

PATENT NO. : 10,637,238 B2
APPLICATION NO. : 16/057958
DATED : April 28, 2020
INVENTOR(S) : Brian Brooks Page 1 of 1

It is certified that error appears in the above-identified patent and that said Letters Patent is hereby corrected as shown below:

In the Specification

Column 5
Line 3, after "units" insert -- . --.

Column 6
Line 51, delete "on-line" and insert -- online --, therefor.

In the Claims

Column 15
Line 2, Claim 5, after "locations" insert -- for --.
Line 8, Claim 7, after "locations" insert -- for --.

Signed and Sealed this
Ninth Day of June, 2020

Andrei Iancu
*Director of the United States Patent and Trademark Office*